United States Patent [19]

Pawloski

[11] Patent Number: 5,581,470
[45] Date of Patent: Dec. 3, 1996

[54] APPARATUS FOR VISUALLY GRAPHICALLY DISPLAYING THE OPERATING POINT OF A GENERATOR IN REFERENCE TO ITS CAPABILITY CURVE INCLUDING DIGITAL READOUTS OF WATTS, VARS AND HYDROGEN PRESSURE

[75] Inventor: James P. Pawloski, Clinton Township, Mich.

[73] Assignee: The Detroit Edison Company, Detroit, Mich.

[21] Appl. No.: 726,214

[22] Filed: Jul. 5, 1991

[51] Int. Cl.⁶ ................................................. G01R 21/00
[52] U.S. Cl. ........................... 364/483; 364/146; 324/114
[58] Field of Search ...................... 364/483, 494, 364/146, 188; 310/53; 324/115, 116, 158 MG, 141, 142, 114; 340/715, 722

[56] References Cited

U.S. PATENT DOCUMENTS

| | | | |
|---|---|---|---|
| 4,029,951 | 6/1977 | Berry et al. | 235/151.21 |
| 4,245,182 | 1/1981 | Aotsu et al. | 322/20 |
| 4,675,147 | 6/1987 | Schaefer et al. | 376/245 |
| 4,698,756 | 10/1987 | Gonzalez et al. | 364/557 |
| 4,766,557 | 8/1988 | Twerochlib | 364/550 |
| 4,788,647 | 11/1988 | McManus et al. | 364/494 |
| 4,959,569 | 9/1990 | Snuttjer et al. | 310/53 |
| 4,979,122 | 12/1990 | Davis et al. | 364/483 |
| 5,132,610 | 7/1992 | Ying-Chang | 324/142 |

OTHER PUBLICATIONS

Hope, G. S. and Malik O. P. and Chang J, "Microprocessor-based active and reactive power measurement" Electrical Power and Energy Systems, Apr. 1981 pp. 75–83.

*Primary Examiner*—Ellis B. Ramirez
*Assistant Examiner*—Kaminis Shah
*Attorney, Agent, or Firm*—Barnes, Kisselle, Raisch, Choate, Whittemore & Hulbert, P.C.

[57] ABSTRACT

A computer-based meter provides a real time graphic display indicative of the operating point, in terms of watt and var flow, of a generator in relation to the capability curve of the generator. Data representative of the capability curve of the generator is stored in memory, processed by a computer and then displayed on the face of the meter. Data representative of watt and var flow is likewise stored and processed and displayed to indicate the operating point of the generator in relation to its capability curve. The meter is software driven so that it can be easily tailored to any generator by merely changing the program stored on a memory chip.

2 Claims, 2 Drawing Sheets

APPARATUS FOR VISUALLY GRAPHICALLY DISPLAYING THE OPERATING POINT OF A GENERATOR IN REFERENCE TO ITS CAPABILITY CURVE INCLUDING DIGITAL READOUTS OF WATTS, VARS AND HYDROGEN PRESSURE

This invention relates generally to a device for indicating the output of a generator, and refers more particularly to a computer-based meter for providing a real time graphic display of the operating point, in terms of watt and var flow, of a generator with respect to its capability curve.

BACKGROUND OF THE INVENTION

An AC generator is comprised of two major parts, the stator winding and the rotor (field) winding. The stator winding is housed in the body of the generator and is physically connected to the system. The rotor winding is wrapped around a shaft which, when driven by a prime mover such as a steam turbine, rotates within the stator. By passing current through the rotor winding as the shaft is rotated by the prime mover, voltage is produced on the stator winding. As power is increased to the prime mover (e.g. by increasing steam pressure to a steam driven turbine), more current flows through the stator winding and thus more power (watts), is delivered to the system. By increasing the current to the rotor winding, the generator produces more 'vars' which, in effect, can raise the system voltage. Conversely, by decreasing the current in the rotor winding, vars are absorbed by the generator, effectively lowering system voltage.

Obviously, there is a limit to the amount of current that can flow through the stator and rotor windings which, in turn, imposes a limit on the amount of watts and vars that the generator can deliver to the system. There is also a minimum value of current that must flow in the rotor field to maintain generator stability, and this imposes a limit on the amount of vars that the generator can absorb from the system. These watt and var limitations can be represented graphically as the generator's capability curve. As long as the operating point of the generator (i.e. the amount of watts and vars flowing out of or into the generator) is inside the capability curve, the generator will be operating within its safe limits.

On large units, hydrogen gas is circulated through the generator to cool the stator and rotor windings, thus allowing more current flow. Therefore, increasing the pressure of the hydrogen gas in the generator increases its capacity.

Devices have been designed to indicate the operating point of a generator with respect to its capability curve. Such devices are useful in maintaining the operation of a generator within safe limits, and also allow the generator to be operated at its full capacity, providing maximum power to the electrical system. Devices currently in use include an electromechanical movement having two markers movable to positions indicative of watt and var flow, respectively, which cross at the operating point against a fixed background display of the generator's capability curve.

SUMMARY OF THE INVENTION

The meter of the present invention is computer-based completely eliminating any internal mechanical movement. Frequently updated data representative of the capability curve of the generator is stored in memory, processed and then displayed on the face of the meter. Data representative of watt and var flow, also frequently updated, is stored and processed and displayed to indicate the operating point of the generator in relation to the capability curve.

The meter of this invention also has the ability to actuate an alarm when the operating point approaches or moves beyond the boundary of the capability curve.

As a further feature of the invention, the meter has means for modifying the capability curve depending upon whether or not the generator is in a manual, rather than an automatic, operating mode.

Because the meter of this invention is software driven, it can be easily tailored to any generator by simply changing the program stored on a memory chip.

One object of this invention is to provide a meter having the above features, one which is simple and easy to operate, composed of a relatively few simple parts, and capable of being readily and inexpensively manufactured.

Other objects, features and advantages of the invention will become more apparent as the following description proceeds, especially when considered with the accompanying drawings.

DETAILED DESCRIPTION

Figure 1:
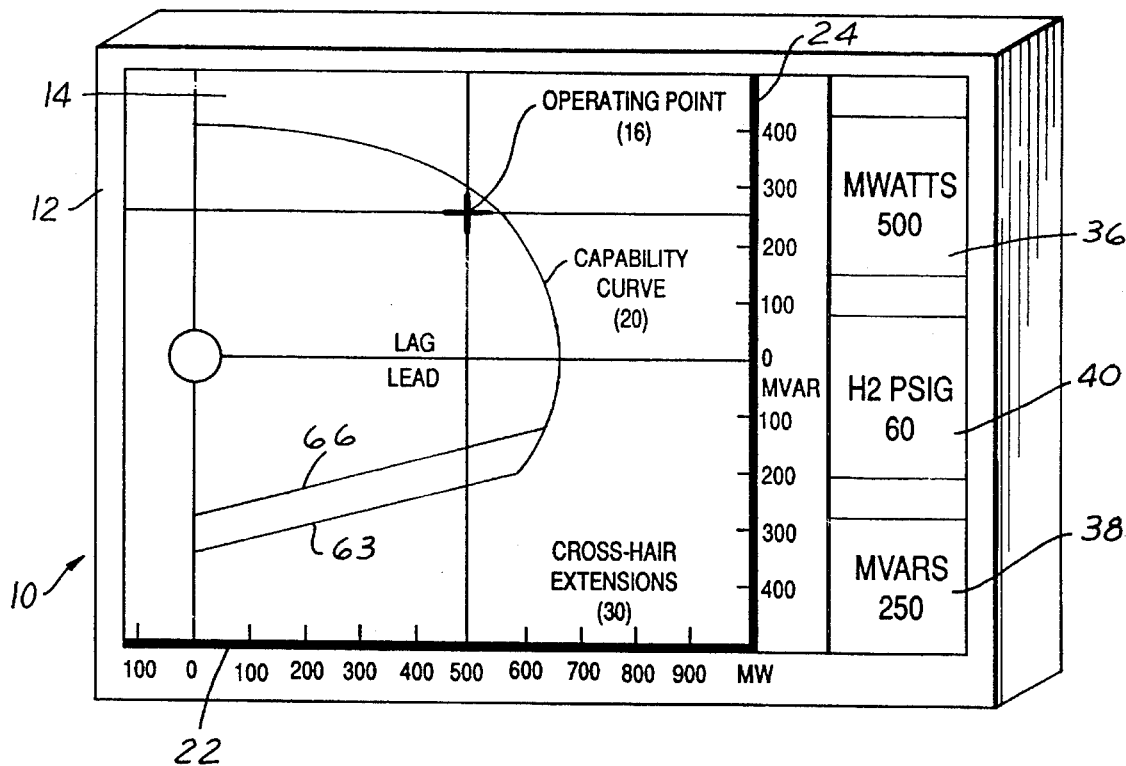
FIG. 1 is a view showing the front face of a meter constructed in accordance with the invention.

Referring now more particularly to the drawings, the meter 10 includes a display unit 12 with a rectangular front face 14 on which may be displayed the operating point 16, in terms of watt and var flow, of an AC generator 18 in relation to its capability curve 20.

Preferably the meter is a fully solid state graphic display meter which utilizes a high resolution liquid crystal display to provide a real time graphic display indicative of the operating point with respect to the capability curve plotted against an X-Y graph representing watts and vars. Watt and var scales 22 and 24 are at right angles to one another and appear along the bottom and right hand edges of the front face 14. The watt and var scale information is stored in non-volatile memory and can be easily changed to accommodate any generator. The capability curve is derived from a hydrogen pressure transducer 26 which is independent of the meter and provides a measure of the pressure of cooling hydrogen gas circulating through the generator. Since the capacity of the generator increases with hydrogen pressure, the capability curve will expand as hydrogen pressure increases. The operating point 16 is displayed on the watt-var graph and consists of a bold "plus" sign with the vertical line thereof indicating watts and the horizontal line indicating vars. The cross-hair extensions 30 cross the watt and var scales to facilitate taking a reading of these values. The operating point is derived from watt and var transducers 32 and 34 independent of the meter. In addition, digital readout of the generator's watt and var output, and of the hydrogen pressure of the generator, is provided at 36, 38 and 40.

Signals from the watt, var and hydrogen pressure transducers are transmitted to and amplified by their respective amplifiers 42, 44 and 46. The transducer signal is typically a current level and therefore must be converted by the amplifiers to a voltage as well as amplified to achieve the 0 to 5 volt signal required by the analog-to-digidal (A/D)

converter 48. These three signals are input into an analog multiplexer 50, which is simply a three-way switch, where they are selected independently by the computer 52 to be read into the A/D converter 48 for storage in the random access memory (RAM) storage media 54. The A/D converter 48 digitizes these analog signals so that they can be processed by the computer.

The computer 52 is preferably a 16 bit microprocessor that reads instructions in the form of digital codes, and then executes these instructions. The instructions, usually called a program, are stored in a Read Only Memory (ROM) storage media 55 and are read by the microprocessor via the data bus 56. The data bus 56 is shown as a path connecting various elements of hardware depicted in FIG. 2. All data entering or exiting the microprocessor travel over the data bus. While carrying out the program, the microprocessor draws on the data in the data ROM 57 in which is stored display information relative to the borders, watt and var scales 22 and 24, boxes for the digital readout display and all of the labeling seen in FIG. 1. The RAM storage media 54 stores the watt and var values and the hydrogen pressure value to be used by the microprocessor in calculating the location of the operating point 16 and straight line cross-hair extensions 30 and the position of the capability curve 20. Unlike ROM memory, which can only be read, RAM can be written to as well as read.

Communication outside the microprocessor is typically done by input and output ports designated 60, 62. Input port 60 allows digital signals to be placed on the data bus to be read by the microprocessor. The outlet port 62 allows the microprocessor to send a digital signal to the outside via the data bus.

Information to be displayed on the face 14 of the display unit is written by the microprocessor 52 over the data bus 56 to the display RAM 70. A display driver 72 reads the information from the display RAM 70 and transmits it to the liquid crystal display unit.

In the interest of safety, the operating point 16 must always be kept within the boundary of the capability curve 20. The lower straight line portion 63 of the capability curve 20, sometimes called the lower reactive limit, is in effect while the generator is controlled by the automatic voltage regulator 64. When, however, the generator is controlled manually, the lower portion of the capability curve is modified by the display of the manual reactive limit 66 which replaces the lower reaction limit 63 as the new lower part of the capability curve. When the generator is controlled by the automatic voltage regulator, the operating point 16 must be within the outline of the unmodified capability curve including the lower reactive limit 63, but when the generator is controlled manually, the outline of the capability curve is reduced by the display of the manual reactive limit 66 and the operating point 16 must be within this reduced area. When the generator is in manual, a switch 68 signals the microprocessor through the input port 60 that the manual curve 66 has been asserted and is in effect.

Figure 2:
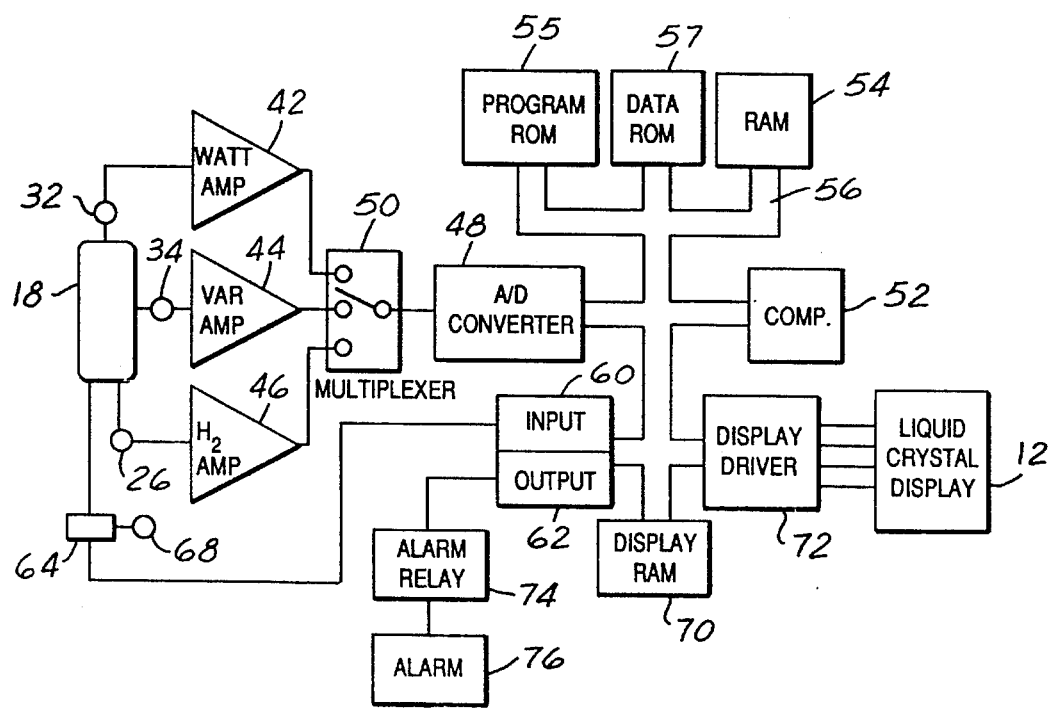
FIG. 2 is a diagrammatic view of the meter, showing the hardware used in a preferred embodiment of the invention.

When the microprocessor calculates that the operating point 16 is outside the boundary of the capability curve, that is to the right of, above or below the capability curve 20 shown in FIG. 1, it will send a signal through the output port 62 to relay 74 to energize the relay and activate an alarm 76.

A typical program loop would execute as follows: The program in ROM 55 instructs the microprocessor 52 to select each position on the multiplexer 50 so that the signals from the transducers 26, 32 and 34 are digitized by the A/D converter 48. The digitized values for watts, vars and hydrogen pressure are stored in RAM storage media 54 where they will be used in computations by the microprocessor to calculate the position of the operating point 16, cross-hair extensions 30 and the applicable capability curve 20. To send information to the liquid crystal display unit 12, the microprocessor writes data over the data bus to the display RAM 70. The display driver 72 will then read the information from the display RAM 70 and send the corresponding digital signals to the liquid crystal display.

When updating the display, the microprocessor will first copy data from the data ROM 57 to the display RAM 70. The display driver 72 reads the information from the display RAM 70 and transmits it to the display unit. As stated above, the data ROM 57 contains static display information such as the borders, the watt and var scales, and all of the labeling, etc. The microprocessor will read the digitized values for watts, vars and hydrogen pressure in RAM storage media 54, from that information calculate the position of the operating point 16, cross-hair extensions 30 and capability curve 20 and then superimpose the same overtop of the information already in the display RAM 70. The numerical values for watts, vars and hydrogen pressure are also written to the display RAM 70 to be read and transmitted by the display driver 72 to the display unit 12 for display at 36, 38 and 40. At this point the microprocessor will read the input port 60 to determine if the manual curve input has been asserted, and if so, it will display the manual reactive limit 66. After all of this information is displayed, the microprocessor will perform several computations to determine if the operating point 16 has crossed over the boundary of the capability curve 20. If the operating point has crossed the boundary, then the microprocessor will send a digital signal through the output port 62 to energize the alarm relay 74 and activate the alarm 76.

Figure 3:
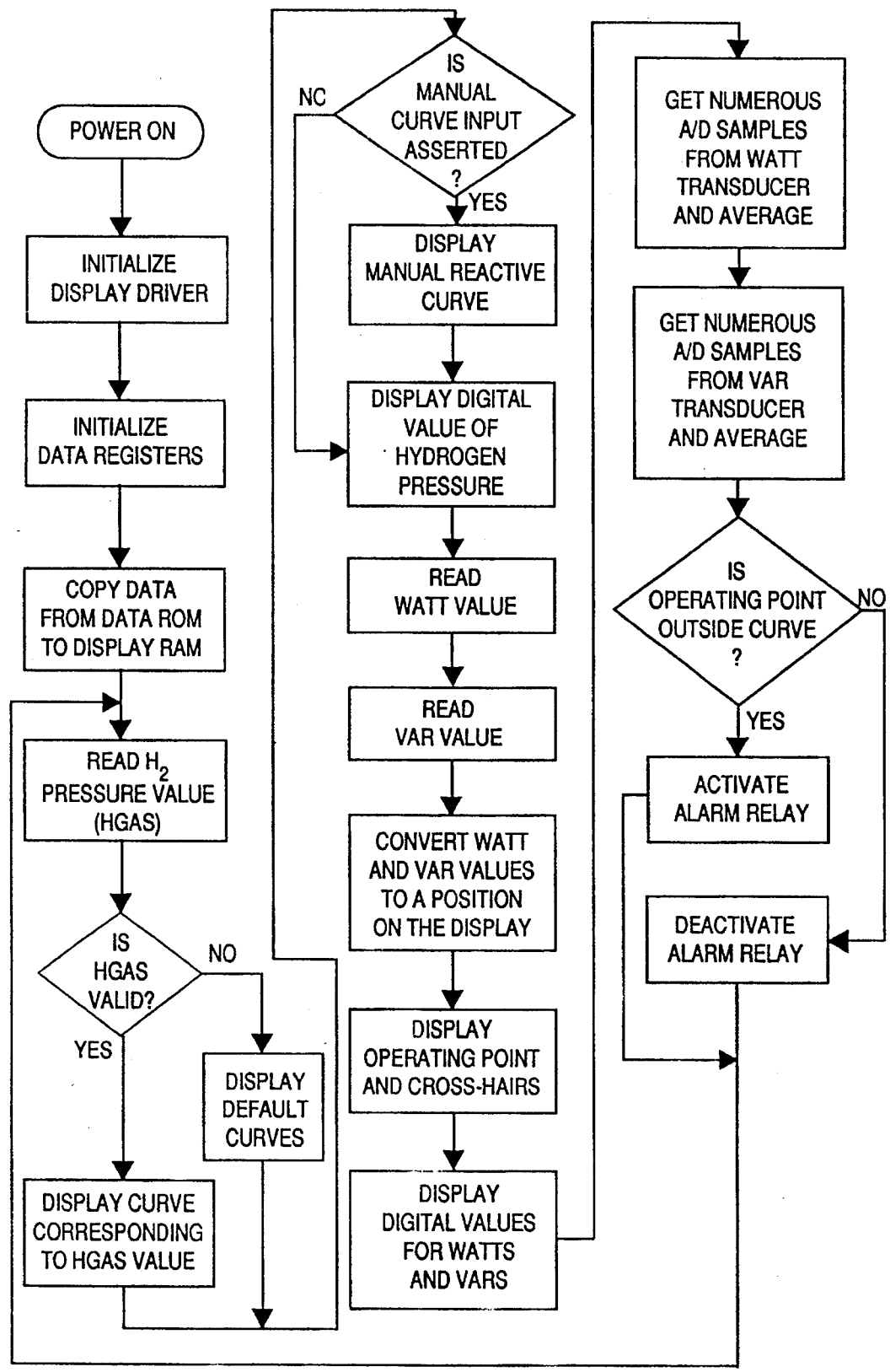
FIG. 3 is a flow chart diagram of the software.

FIG. 3 is a flow chart representation of the software. As noted, as soon as the power is turned on, the display driver 72 as well as the various data registers are initialized, after which data is copied from the data ROM 57 to the display RAM where it is picked up by the display driver 72 for display on the face of the display unit 12.

The microprocessor then reads the hydrogen pressure value from the data RAM 54 and if this is a valid reading the microprocessor calculates the position of the applicable capability curve and transmits such information to the display unit 12 via the display RAM 70 and display driver 72. In the event of an invalid hydrogen pressure reading, that is one outside the normal parameters of the generator being monitored, a display default curve, easily recognizable as such, is displayed.

Next the microprocessor will determine whether the manual curve input has been asserted at the input port 60 and if so the manual reactive curve 66 will be displayed followed by the display of the digital value of hydrogen pressure. If not, the manual reactive curve will not be displayed but, of course, the digital value of hydrogen pressure will be displayed.

Thereafter, the watt and var values in the data RAM 54 are read by the microprocessor and converted to a position on the display unit 12 in the form of an operating point 16, and the operating point 16 with cross-hair extensions 30 are plotted on the display unit face 14 via the display RAM 70 and display driver 72. Digital values for watts and vars are also displayed on the face of the display unit.

The microprocessor will take numerous samples of watt, var and hydrogen pressure values as input to the data RAM 54, average them and determine whether the operating point is inside or outside of the capability curve. If inside the capability curve, the alarm relay 74 is not activated and the cycle repeats by first taking a reading of hydrogen pressure. If outside the capability curve, the alarm relay 74 is energized to activate the alarm 76.

The meter repeats the cycle, preferably about four times per second, to obtain an update in the readings of hydrogen pressure, watt and var values. In the first cycling after the power is on, there may be no hydrogen pressure, watt or var values in the RAM 54, but these values appear in subsequent cycles as the microprocessor writes these digitized values from the transducers 26, 32 and 34 into the RAM 54.

What is claimed is:

1. Apparatus for providing a real time visual graphic display indicative of the operating point, in terms of watt and vat flow, of a generator in relation to the capability curve of the generator, comprising in a visual display unit, a computer, memory storage media for storing program instructions and for transmitting such program instructions to said computer and for receiving and temporarily storing watt, vat and capability curve data and for transmitting such data to said computer for use by said computer in calculating the positions of said operating point and the applicable capability curve in accordance with said program instructions, means for measuring watt and var flow of an operating generator and transmitting data representative of the measured watt and var flow to said memory storage media for storage, means for measuring data from which the applicable capability curve of said operating generator can be calculated and transmitting the same to said memory storage media, said computer being operative to read the watt, var and capability curve data from said memory storage media and process the same to calculate the positions of said operating point and applicable capability curve and produce data representative of such calculations in accordance with the program instructions from said memory storage media, and means for reading the data representative of such calculations from said computer and transmitting the same to said display unit to visually, graphically display on said display unit the operating point of the generator in terms of watt and var flow in relation to the capability curve of the generator, means for indicating when said generator is operated manually and to signal said computer of such manual operation, said computer being operative upon receiving said signal indicative of manual operation to produce data representative of the position of a modified portion of said capability curve, said data reading means being operative to read the data representative of the position of said modified portion of said capability curve and transmit the same to said display unit for visual graphic display.

2. Apparatus for providing a real time visual graphic display indicative of the operating point, in terms of watt and var flow, of a generator in relation to the capability curve of the generator, comprising in visual display unit, a computer, memory storage media for storing program instructions and for transmitting such program instructions to said computer and for receiving and temporarily storing watt, var and capability curve data and for transmitting such data to said computer for use by said computer in calculating the positions of said operating point and the applicable capability curve in accordance with said program instructions, means for measuring watt and var flow of an operating generator and transmitting data representative of the measured watt and var flow to said memory storage media for storage, means for measuring data from which the applicable capability curve of said operating generator can be calculated and transmitting the same to said memory storage media, said computer being operative to read the watt, var and capability curve data from said memory storage media and process the same to calculate the positions of said operating point and applicable capability curve and produce data representative of such calculations in accordance with the program instructions from said memory storage media, and means for reading the data representative of such calculations from said computer and transmitting the same to said display unit to visually, graphically display on said display unit the operating point of the generator in terms of watt and var flow in relation to the capability curve of the generator, wherein said last-named means includes display storage media for receiving the data representative of such calculations from said computer, and a display driver for reading the data from said display storage media and for transmitting the same to said display unit for visual graphic display, and wherein the measured data from which the applicable capability curve can be calculated is the pressure of hydrogen circulated through the generator, wherein said memory storage media contains background data representative of a scale of watts and a scale of vars, said computer being operative to calculate from said background data the positions of said scales along right angle margins of the display of said operating point in relation to said capability curve and transmit the same to said display storage media, said display driver being operative to read said background calculations from said display storage media and transmit the same to said display unit for visual graphic display, wherein said computer is operative to calculate straight line extensions of said operating point at right angles to one another which cross said respective scales when displayed on said display unit and transmit the same to said display storage media, said display driver being operative to read the straight line extension calculations from the display storage media and transmit the same to said display unit for visual graphic display, including means for indicating when said generator is operated manually and to signal said computer of such manual operation, said computer being operative upon receiving said signal indicative of manual operation to produce data representative of the position of a modified portion of said capability curve and transmit the same to said display storage media, said display driver being operative to read the data representative of the position of said modified portion of said capability curve and transmit the same to said display unit for visual graphic display.

\* \* \* \* \*